United States Patent [19]

Kijima et al.

[11] Patent Number: 5,654,582
[45] Date of Patent: Aug. 5, 1997

[54] CIRCUIT WAFER AND TEG TEST PAD ELECTRODE

[75] Inventors: Kazuhiro Kijima, Kawaguchi; Hitoshi Hattori, Tokyo-to, both of Japan

[73] Assignee: Texas Instruments Incorporated, Dallas, Tex.

[21] Appl. No.: 435,594

[22] Filed: May 5, 1995

[30] Foreign Application Priority Data

May 6, 1994 [JP] Japan .................................. 6-117626

[51] Int. Cl.⁶ ........................ H01L 21/78; H01L 27/02; H01L 29/34; H01L 27/12
[52] U.S. Cl. ........................ 257/620; 257/208; 257/210
[58] Field of Search ........................ 257/620, 211, 257/210, 208

[56] References Cited

U.S. PATENT DOCUMENTS 4,967,259  10/1990  Takagi ........................ 257/620
5,136,354  8/1992  Morita et al. ........................ 257/620
5,414,297  5/1995  Morita et al. ........................ 257/620

FOREIGN PATENT DOCUMENTS

0363179  4/1990  European Pat. Off. ........ 257/620
0270245  10/1989  Japan ........................ 257/620

Primary Examiner—Sara W. Crane
Assistant Examiner—Alexander Oscar Williams
Attorney, Agent, or Firm—David S. Guttman; Richard L. Donaldson

[57] ABSTRACT

A semiconductor wafer and semiconductor device manufactured from the wafer. The wafer has a conductive layer 33A intermittently formed in the longitudinal direction of a scribe area 2. The conductive layer's width shorter width than its length and shaped so that the scribe area is cut in the longtitudinal direction including the location of said width. The invention provides a semiconductor wafer not giving rise to faults, such as short-circuiting due to shavings, and not requiring any modification in the scribed width, blade width, or pad size when sawing conductive layers in the scribe area, such as the above-mentioned pads of the TEG.

6 Claims, 10 Drawing Sheets

CIRCUIT WAFER AND TEG TEST PAD ELECTRODE

This invention relates to semiconductor integrated circuit manufacture, and more particularly to a semiconductor wafer having a scribe area between chip areas and to a semiconductor device formed on such a semiconductor wafer.

BACKGROUND OF THE INVENTION

Conventionally, in semiconductor integrated circuit (IC) device production, a minimum required pattern of elements to be tested, referred to as the TEG (Test Element Group), is formed on a scribe area of the semiconductor wafer and then electrically probed to determine if the elements in the IC chips formed on the wafer are properly formed.

Since the TEG is made using the same process used to form the elements in the IC chips (to be separated by cutting in the scribe area), measurements of the electrical properties of the TEG are equivalent to measurements of the electrical properties of the elements in the IC chips. Thus, the properties of the IC chips can be accurately inferred by testing the TEG.

By placing the TEG in the wafer's scribe area, the number of IC chips which can be made from one semiconductor wafer is not reduced by the presence of the TEG.

Figure 26:
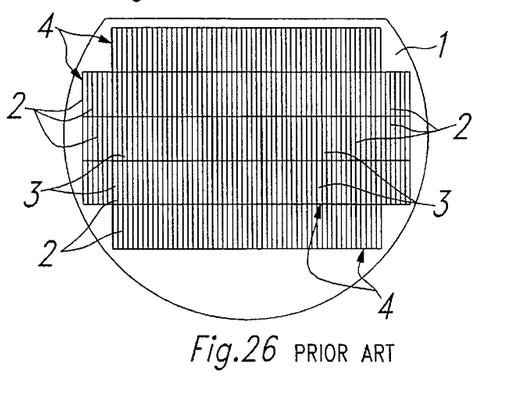
FIG. 26 is a layout showing the mask regulating a pattern of the semiconductor chip on the semiconductor wafer.

FIG. 26 shows an example of a layout of IC chips to be formed on a silicon wafer 1. The wafer is divided in both the longitudinal and transverse directions by thin scribe areas (lines) 2, which are places where the wafer will be cut to separate the numerous individual long, thin IC chip areas 3 formed on the wafer. The chip areas 3 are grouped by 6 to form unit transfer patterns 4.

Many (in this case 36) unit transfer patterns 4 are formed on the wafer. The size of the transfer pattern 4 is approximately 17 mm (length)×approximately 12 mm (width); (and the depth of an IC chip area is approximately 2 mm).

Figure 27:
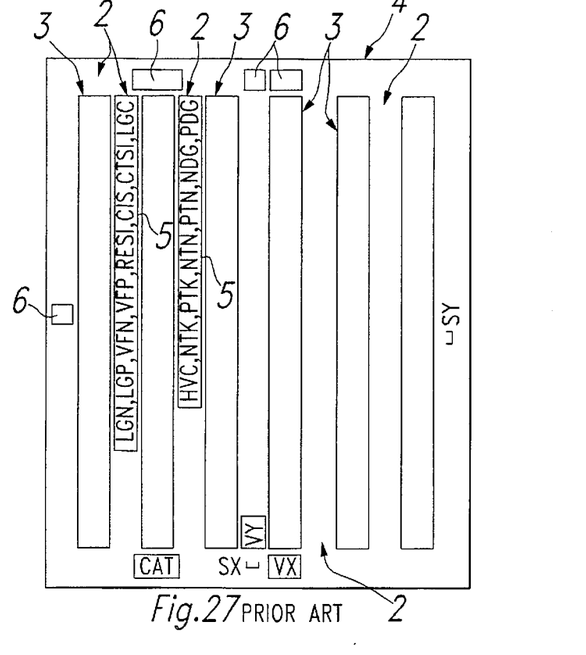
FIG. 27 is a layout showing a unit reticle containing several semiconductor chips.

FIG. 27 shows a model of reticle (glass mask) forming a unit transfer pattern 4. A scribe area 2 is formed around each of the six IC chip areas 3. Each chip may contain ten or more to less than twenty pins for input terminals and 160 pins for output terminals (bond pad)). A TEG 5 is placed in area 2. The TEG 5 may be placed in the other scribe areas, as is partially shown in FIG. 27. In the FIG. 6 represents a block cell required to correctly transfer the reticle pattern.

The elements making up TEG 5 are indicated by the following abbreviations: LGN: Logic Gate N-ch Tr (n-channel transistor for logic gate); LGP: Logic Gate P-ch Tr (p-channel transistor for logic gate); VFN: Field N-ch Tr (field n-channel transistor); VFP: Field P-ch Tr (field p-channel transistor); RES: Resistor (resistor); CTS: Contact Chain (contact chain); LGC: Logic Gate Capacitor (capacitor for logic gate).

Figure 28:
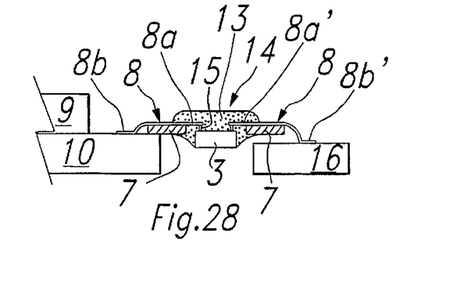
FIG. 28 is a cross-sectional view showing semiconductor chips made with the reticle, which are integrated as a driver for an LCD (liquid crystal display).

After completing the testing of TEG 5, which will be described later, IC chip 3 is separatedby cutting along the scribe lines 2 shown in FIG. 27. As shown in FIG. 28, both inner leads 8a and 8a' of a lead frame 8 formed on a polyimide film 7, are bonded to a bump electrode 15 (bump bond pad) using the TAB (Tape Automated Bonding) method. A package formed using this method is referred to as a TCP (Tape Carrier Package).

Figure 29:
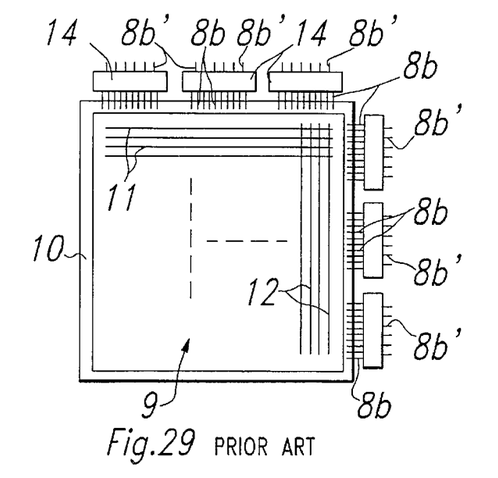
FIG. 29 is a plane view showing the LCD.

Three IC chips 3 on each side of the substrate 10 are bonded to connect them with matrix electrodes 11 and 12 of LCD 9 through the outer lead 8b as drivers for the 160×3 channel liquid crystal display (LCD) 9, which is shown in FIG. 29.

The IC chip 3 is sealed with a molded resin 13, such as an epoxy resin, and packaged (in FIG. 29, package 14 is shown). The IC chip 3 is bonded to the inner leads 8a and 8a' using the bump electrode 15. Both the inner lead 8a and the outer lead 8b provide output used for driving to LCD 9. Both the inner lead 8a' and the outer lead 8b' supply a specific input through a printed wiring substrate 16 (not shown in FIG. 29), which is connected to the outer lead 8b' to the IC chip 3.

Figure 30:
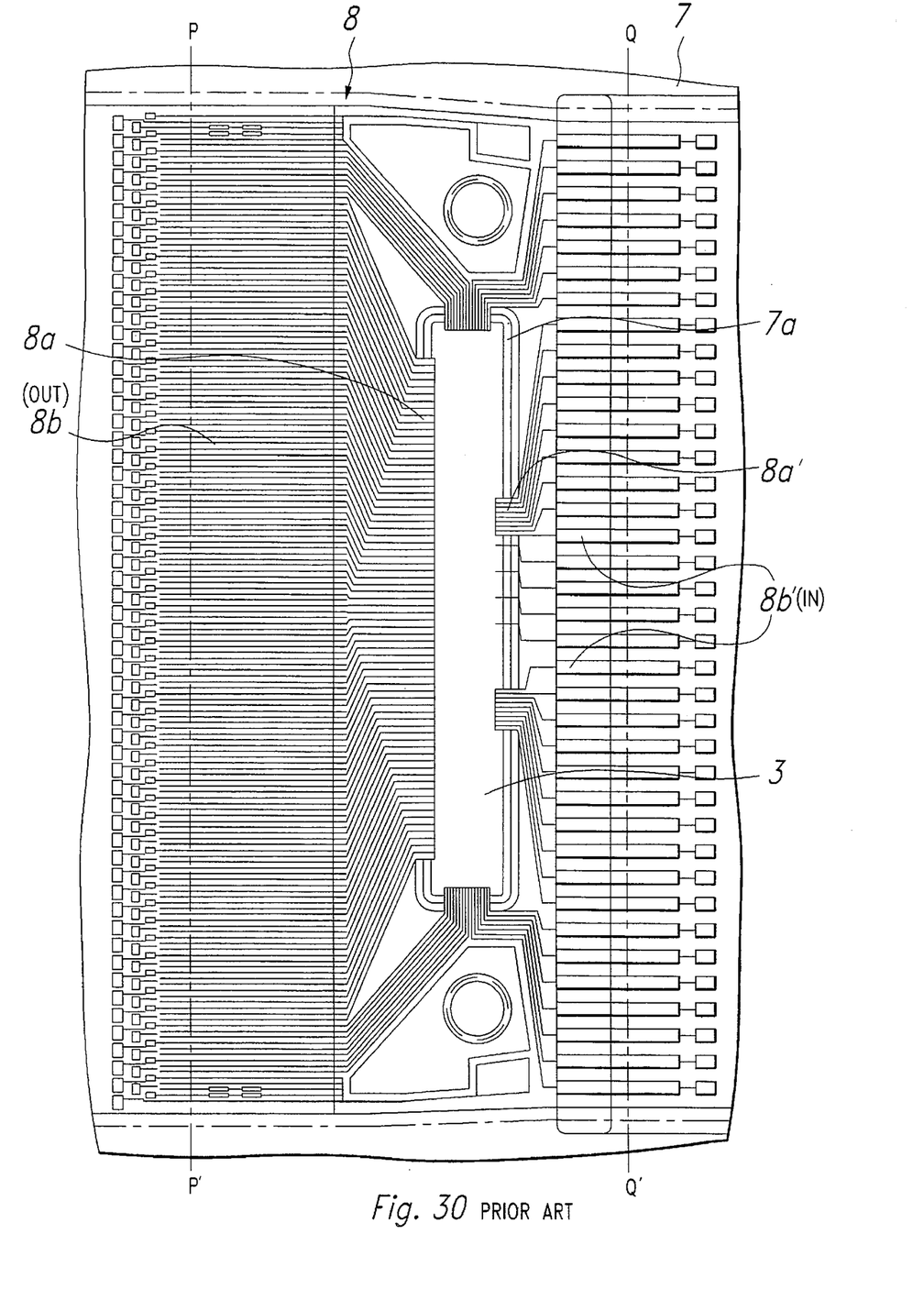
FIG. 30 is a plane view showing the lead frame mounting semiconductor chips.

FIG. 30 shows the pattern of the lead frame 8 using the above-mentioned TCP. The polyimide film 7 used as the carrier is cut by punching on the P-P' and Q-Q' lines. Both the inner lead 8a used for input and the inner lead 8a used for the output extend to the thin and long opening 7a. Their free terminals are bonded to the bump electrodes of IC chip 3.

In the following, the scribe area 2 shown in FIG. 27 and details concerning its surroundings are explained with reference to FIGS. 31 and 32.

Figure 31:
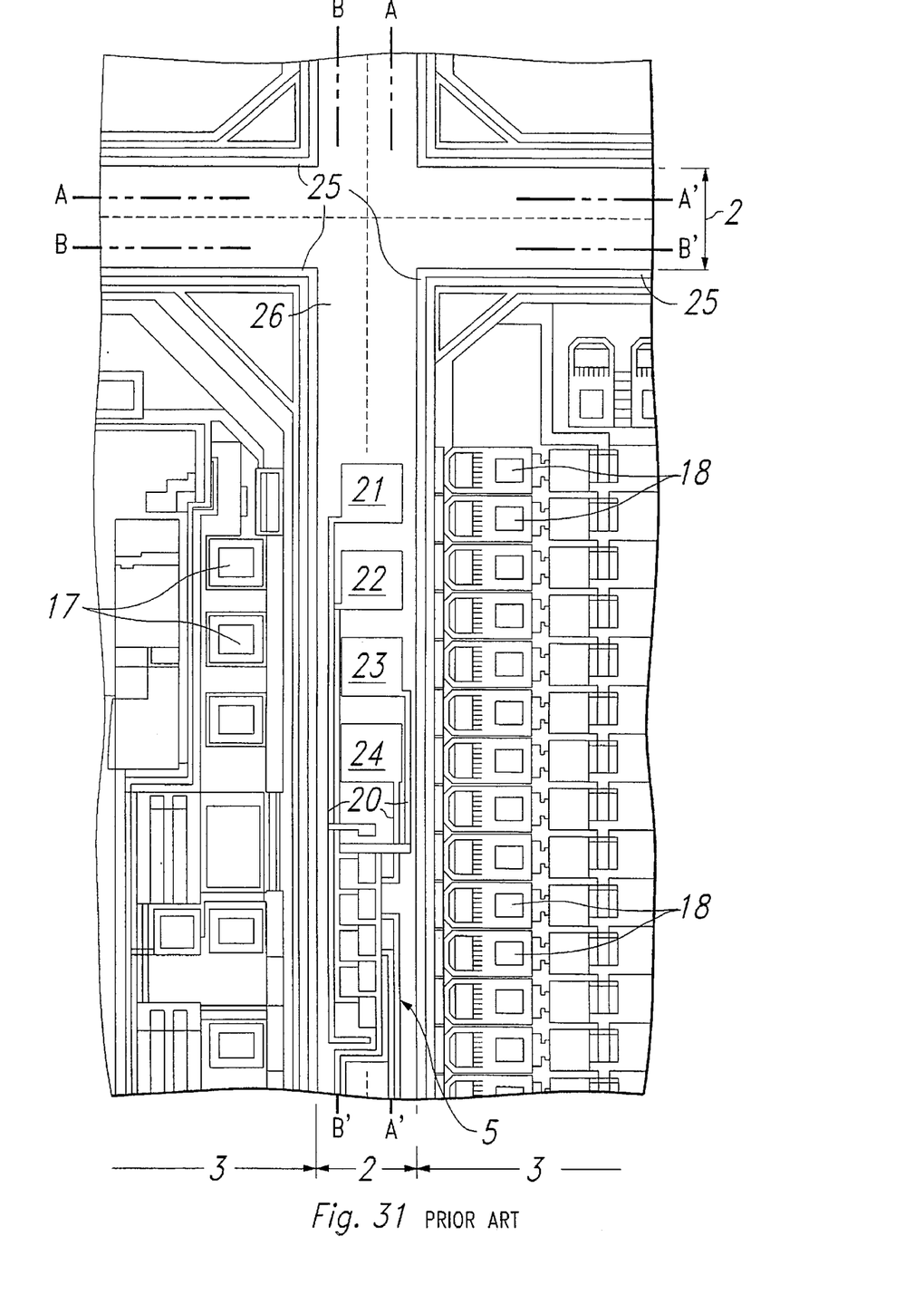
FIG. 31 is a plane and enlarged view showing the details of the major parts of a conventional semiconductor wafer including the scribe area.
Figure 32A:
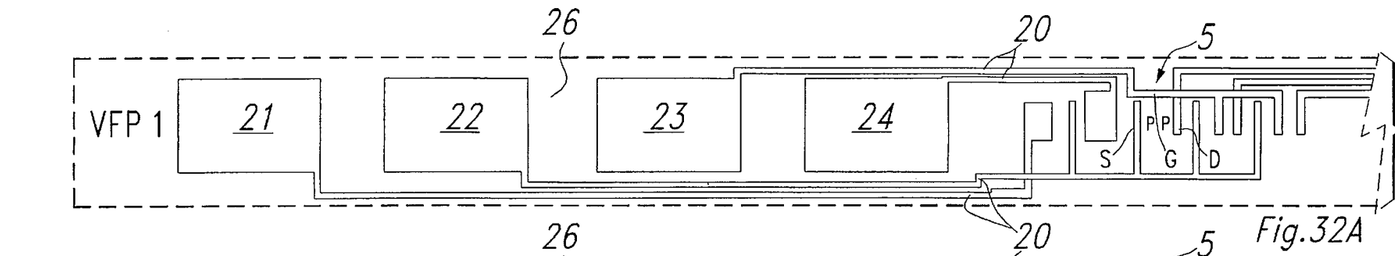
FIG. 32 is a plane view showing each pattern of the TEG in the scribe area of the semiconductor wafer.
Figure 32B:
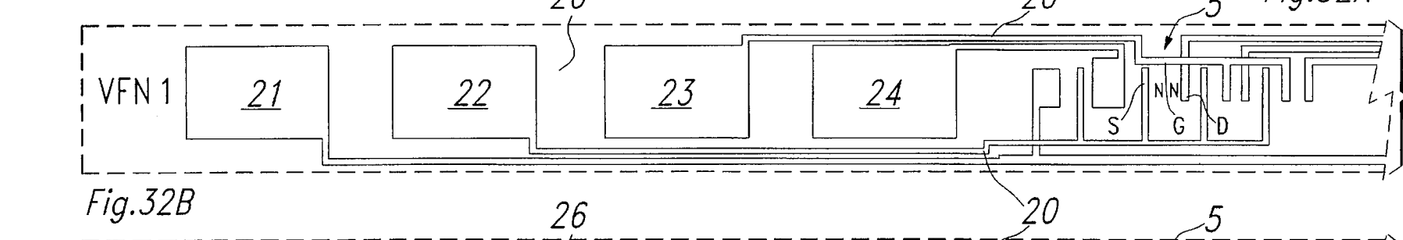
Figures 32C, 32D:
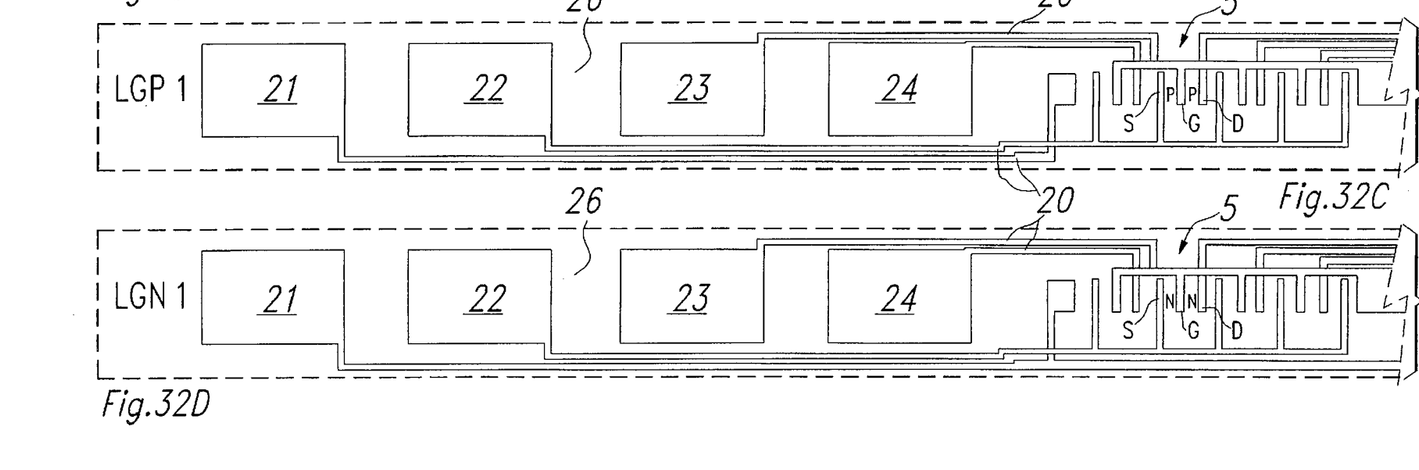

As seen in FIG. 31, the scribe area 2 surrounds the IC chip area (active area) 3 where the input pad 17 and the output pad 18 are formed; a TEG 5 is placed on each of the scribe areas. The depth of the scribe area 2 is determined by the terminal of the protective film 25 (e.g., a silicon nitride film) of the IC chip.

After completing testing of the TEG, scribe area 2 is cut (diced) along A-A' and B-B' as the cutting ends with a blade whose width is either A–B or A'–B'. For example, diamond powder (approximately 5 μm) may be impregnated in the outer circumference of a copper disk (approximately 35 μm thick), then rotated at a high speed to saw the semiconductor wafer.

The TEG 5 consists of elements with various patterns. In FIG. 32, four types (VFP1, VFN1, LGP1, LGN1) are shown. MOS transistors that should be tested as elements are formed. In the figure, P represents a p-type diffusion area. N represents an n-type diffusion area. S represents the source electrode. D represents the drain electrode. G represents the gate electrode (The other elements are not described).

Each of the electrodes of the MOS transistor is introduced through wiring 20 to pads (terminal electrodes) 21, 22, 23, 24, . . . , on an insulating film 26. The probe needle is brought into contact with the pads, and the electrical properties of MOS transistors are measured by the probe test. The pads (21) and wiring 20 may be made of a metal (such as aluminum containing small amounts of additives; such as copper).

The inventors conducted investigations on TEG 5, and found that the following problems arose because the metal films of pads 21–24 . . . were cut along cutting positions A-A' or B-B' shown in the figure.

Figure 33:
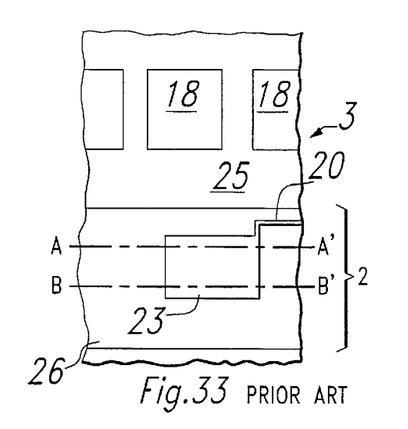
FIG. 33 is a plane and enlarged view showing the diced part in the major area of the semiconductor wafer.
Figure 34:
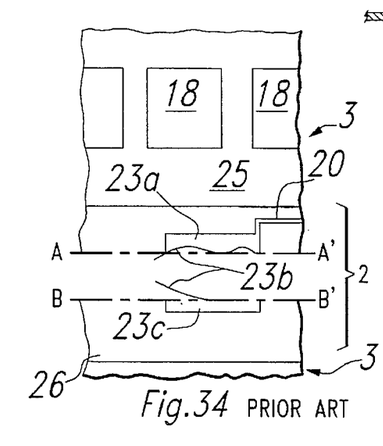
FIG. 34 is a plane view showing the same area shown in FIG. [33] after dicing.

As seen in FIG. 33 (overviews of the required and major parts for the explanation are shown: from now on, the same), in the case in which scribing is done along A-A' and B-B' as the cutting ends, after completing the testing, to separate each of the IC chip 3 areas shown in FIG. 34, the pad 23 is continuously cut along its entire length along both A-A' and B-B', so a partial pad 23a remains in the end of the IC chip 3, and abatement of the pad metal (cutting burr) 23b are produced.

As the abatement 23b is produced based on the length of the pad 23, in the case in which the pad 23 is longer in the direction of cutting, the abatement 23b is long. Therefore, in the case of the above-mentioned pad 23, the abatement 23b must be long.

Figure 35:
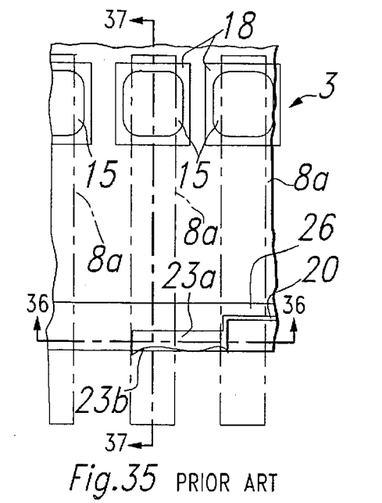
FIG. 35 is a plane view showing the diced semiconductor chip where the lead is bonded to the semiconductor chip.
Figure 36:
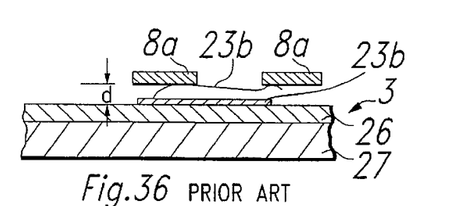
FIG. 36 is a cross-sectional view of XXXVI—XXXVI wirings.
Figure 37:
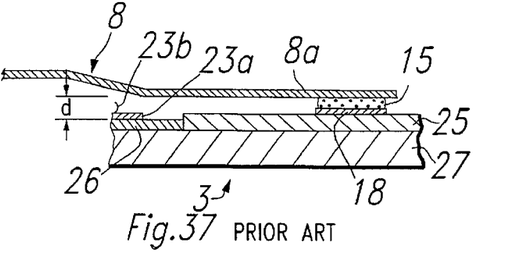
FIG. 37 is a cross-sectional view of XXXVII—XXXVII wirings.

As seen in FIGS. 35–37, while abatement 23b is left, when the inner lead 8a of the lead frame is bonded through the bump electrode 15 to the output pad 18 (as in the case of input pad 17), which is formed on the insulating film 25 on the silicon substrate 27 of the IC chip 3 shown in FIG. 28, the above-mentioned long abatement 23b may come into contact with either inner leads 8a or 8a, resulting in an electrical short circuit either between the inner lead 8a and the semiconductor chip 3, or between both of the inner leads, resulting in the production of a defective IC chip 3.

A defect is likely to occur because, in the case of bonding using a TCP, the distance d between the lead 8a and the edge of the IC chip 3 (the distance d depends on the height of the bump electrode 15, and is usually 15–20 μm, which is very short) is less than that for wiring bonding. Since the length (cutting depth) of the above-mentioned pad 23 along the cutting direction is 100 μm, which is large, the abatement 23b produced by cutting is much longer than the above-mentioned distance d; this results the likelihood of short-circuiting.

In order to solve this problem, the above-mentioned production of the abatement may be prevented. A wide blade capable of covering and cutting the whole pad 23 can be used. However, in this case, the scribe area must be large enough for the wide blade, resulting in a decrease in the number of IC chips made from the semiconductor wafer.

Reducing the size of pad 23 such that it is smaller than the blade width, while maintaining the blade width, has been considered. However, there are limits to the reduction of the size of the pad 23 using the present technology. Therefore, the above-mentioned solution is not suitable.

The purposes of this invention are to provide a semiconductor wafer that does not give rise to faults, such as short-circuiting due to abatement, and that does not require any modification in the scribed width, blade width, or pad size when cutting conductive layers in a scribe area, such as the above-mentioned pads of the TEG, and to provide a semiconductor device made using the semiconductor wafer.

SUMMARY OF THE INVENTION

This invention pertains to a semiconductor wafer with a conductive layer, which is intermittently formed in the longitudinal direction of the scribe area and has a width (that is, crossing the above-mentioned length at 90°) that is shorter than the length of the above-mentioned conductive layer, that contains a scribe area, which can be cut along the above-mentioned length and has a width that is shorter than the length. The inventors investigated the causes of the above-mentioned faults in order to complete this invention, then verified, using a microscope to observe the cut surfaces of the scribe area, that the produced abatement of the pad metal correspond to the cut width of the pad (the width along the cutting direction), the longest, and that no abatement which is longer than the cut width of the pad could be produced. The inventors discovered that, if the cutting width of the pad is small, short abatement can be produced such that there is no contact with the leads (such as the inner leads) of the TCP, as was previously described; thus, they finally completed this invention.

In this invention, since conductive layers, such as the pad metal, are intermittently formed in the longitudinal direction in the scribe area (several conductive layers are placed with a specific distance between the layers), the width of each conductive layer along the scribe area's longitudinal direction is less than the length crossing this width, and the small width is cut. The cut width of the conductive layer can be much less than that of a conventional product, with the result that shorter abatement is produced than those made using a conventional product. The width of the conductive layer is preferably 2–30 μm more preferably 2–10 μm.

When the leads are bonded to the semiconductor chips after cutting, even if abatement remains, the abatement will not be in contact with the leads, so short-circuiting between the leads and the semiconductor chips, or between the leads themselves, can be efficiently prevented. Because short abatement is produced, the scribed width or the blade width can be made larger than the pad to prevent the production of abatement, and the number of semiconductor chips made from one semiconductor wafer can be increased.

The width of the above-mentioned conductive layer, which is intermittently formed on the semiconductor wafer of this invention (the cut width is along the length of the scribe area), must be adjusted so that it is equal to or less than the distance between the leads (such as the inner leads) bonded to the pads for the signal input and/or the signal output of the semiconductor chips, which are separatedby cutting the scribe area, and the above-mentioned semiconductor chips.

The following is based on knowing that the length of the abatement of the conductive layer is less than the cut width. When the cut width of the conductive layers is less than the distance between the leads and the semiconductor chips, [the size of] the abatement of the conductive layers extending from the semiconductor chips is less than the above-mentioned distance; consequently, there is no contact between the abatement of the semiconductor chips (which are actually conductive layers remaining after cutting) with the leads. Therefore, no short-circuiting occurs between the leads and the semiconductor chips, or between the leads themselves, due to contact of the conductive layers with the leads.

Use of conductive parts between the conductive layers, which are intermittently formed to connect the layers, is desired for the semiconductor wafer of this invention. In particular, it is desired to use the same type of conductive parts to connect layers (or to combine layers) in order to use the conductive layers as pads.

The edge width of the above-mentioned conductive layer is desirably smaller than that of the other parts, so that the cutting can be done easily, and the amounts of abatement can be reduced. If the edge of the conductive layer rises, the rising part can be an effective stop for the probe needle when probing; this facilitates the probing operation. For instance, intermittently formed conductive layers can be formed on both sides of the connected part.

This invention provides a semiconductor wafer with a conductive layer, which is intermittently formed in both the length and width of the scribe area and is connected to the substrate layer that contains the above-mentioned scribe area, including the above-mentioned conductive layer, which is cut longitudinally.

In the case of the semiconductor wafer, since the conductive layer is intermittently formed along the cutting direction (longitudinal direction) of the scribe area, the size of the abatement of the conductive layer can be made small without modifying the size of either the scribed width, blade width, or conductive layer. Because of the good support provided by the substrate layer, the conductive layer can be also be intermittently formed along the width of the scribe area (crossing the length at 90°), so that the entire conductive layer, whose shape is like an island, can be formed. If the substrate layer effectively connects the above-mentioned conductive layers (property of the connection between the conducting layers), no connective parts are required for the conductive layer.

In the case of the semiconductor wafer of this invention, the above-mentioned conductive layer (especially, a metal layer) may be formed in the scribe area as a terminal electrode (pad) for the TEG previously described. When forming elements for testing in the scribe area and forming a conductive layer as a pad for the elements for testing, the probe needle is in contact with the conductive layer used as the pad for testing, and after completing the testing, the scribe area is cut to remove at least part of the above-mentioned conductive layer with the elements for testing.

This invention also provides a semiconductor device (semiconductor chip) made from the above-mentioned semiconductive wafer. After cutting the scribe area of the semiconductor wafer, the conductive layer may be partially and intermittently left on the cut part in the case of the semiconductor device.

The shape of the conductive layer before cutting can be identified by either the shape or the pattern of the remaining conductive layer. Even if the conductive layer partially remains on the semiconductor chip, neither the characteristics nor the performance of the chip will be adversely influenced.

Pads for signal input and/or signal output are formed in a semiconductor device of this invention, and leads (such as the inner leads) are bonded to the pads using the TCP bonding method.

The semiconductor device can be made using the following processes: cutting the above-mentioned semiconductor wafer in the scribe area to separate the semiconductor chips and bonding the leads (such as the inner leads) to the pads for signal input and/or signal output for the separated semiconductor chip using the TCP bonding method.

In the figures, the parts are labeled as follows: 1 semiconductor wafer; 2 scribe area; 3 semiconductor (IC) chip; 4 single transfer pattern; 5 TEG; 7 polyimide film; 8 lead frame; 8a, 8a ' inner lead; 8b, 8b ' outer lead; 9 LCD; 14 package; 16 printed circuit board; 17 input pad; 18 output pad; 20 wiring; 23, 31, 32, 33, 34 pad used for TEG; 23a, 33a [sic; 23A, 33A] remaining part of pad; 23b, 33b [sic; 23a, 33a ] abatement; 25, 26 protection film; 27 substrate; 31A, 32A, 33A, 33A', 34A branch; 31B, 32B, 33B, 34B connective part; 31C, 32C, 33C, 34 contact part; 41 probe needle; 42, 44, 54, 64 polysilicon layer; 45 projection point;

46, 56, 66 insulating film; 53, 73 contact hole; 63 pad metal; 88 wiring; 93 metal layer; a width; b pitch; A-A', B-B' cutting line.

DESCRIPTION OF EMBODIMENTS

In the following, the embodiments of this invention are explained.

FIGS. 1–14 describe the first embodiment of this invention, which applies to the TCP (Tape Carrier Package).

In this embodiment, the pad 33 with a comb-shape shown in FIGS. 1–4 is formed as a terminal electrode for the probe test for the TEG (Test Element Group) in the scribe area 2 of the semiconductor (silicon) wafer. The other parts are basically the same as those in FIG. 36. Common parts are given the same reference numerals and additional explanations are omitted (from now on, same).

Figure 1:
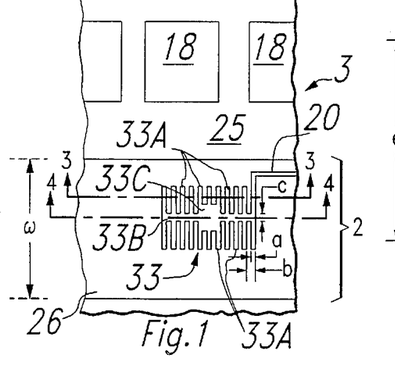
FIG. 1 is a plane and enlarged view of the major areas of a semiconductor wafer, including a scribe area used for the embodiments of this invention.

The pad 33 consists of the following: the width a along the length of scribe area 2; the branch 33A regularly and intermittently arranged along the cutting direction with pitch b; the linear connective part 33B which has a width c and connects the branches along the scribing direction in the middle. In this embodiment, a rectangular contact part 33C used to contact the substrate layer 40 is formed in the middle of pad 33.

Because each intermittently arranged branch 33A is cut in pad 33, the width a of the branch 33A along the cutting direction is very important in achieving the above-mentioned purposes of this invention.

As previously mentioned, the distance d (equivalent to the height of the bump electrode 15) between the inner lead 8a and the semiconductor chip 3 is usually 15–20 μm, and the width a of the above-mentioned branch 33A may be fixed so that it is equal to or less than distance d. However, considering variations in distance d, width a must be fixed so that the length of the abatement is equal to or less than 10 μm (width a: 10 μm or less, for embodiment, 5 μm).

Figure 6A:
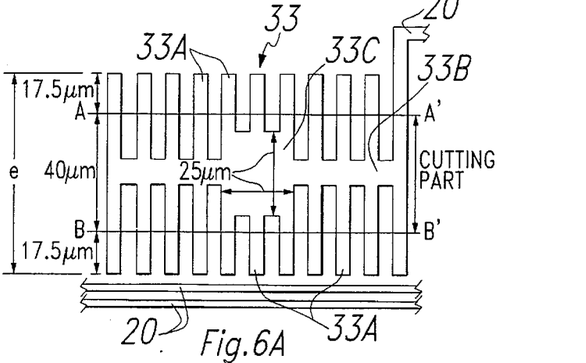
FIGS. 6(A) and 6(B) show enlarged views of the dicing process in the same major area shown in FIG. 1.
Figure 6B:
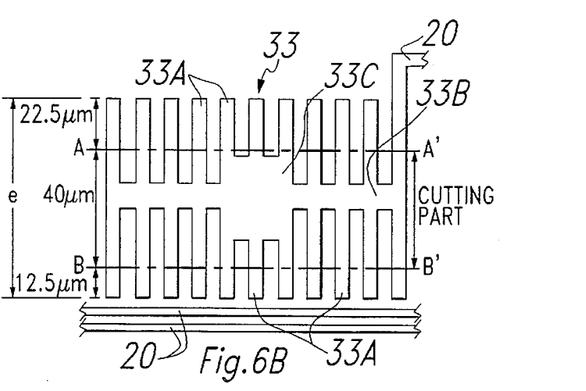
Figure 9:
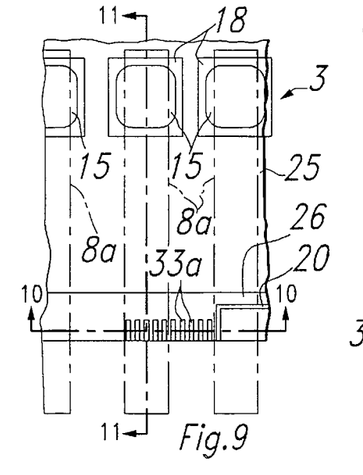
FIG. 9 is the same plane view showing the bonding of the lead to the diced semiconductor chip.
Figure 10A:
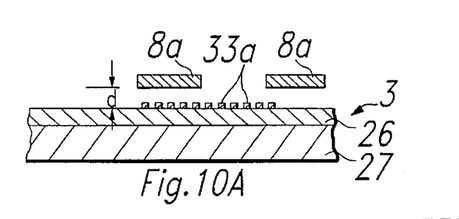
FIG. 10 is a cross-sectional view along line X—X shown in FIG. 9.
Figure 10B:
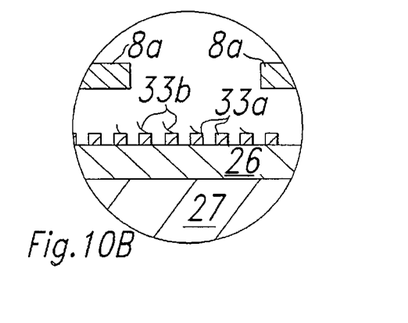

The length of the abatement 33a made from the branch 33A can be 10 μm or less when scribing (cutting: which may also be referred to as dicing), as shown in FIG. 6 and described later, by specifically fixing width a of the branch 33A of the pad. Short-circuiting of the inner lead 8a and the semiconductor chip 3 can be effectively prevented, as shown in FIGS. 9 and 10.

Figure 2:
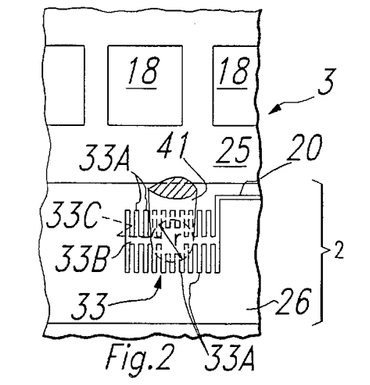
FIG. 2 is the same plane view of the same major area as shown in FIG. 1, further showing the probe process.
Figure 3:
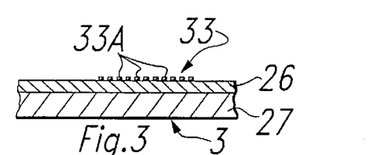
FIG. 3 is a cross-sectional view along line III—III of FIG. 1.
Figure 4:
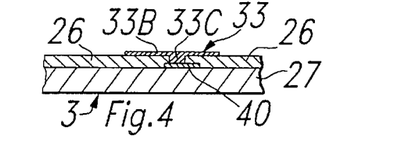
FIG. 4 is a cross-sectional view along line IV—IV of FIG. 1.
Figure 5:
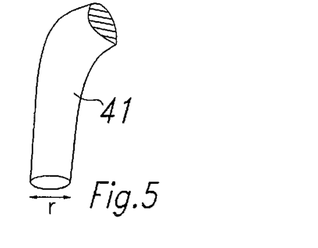
FIG. 5 is a prior art plane and enlarged view showing the probe needle used for probing.

Since the pad 33 must electrical contact the probe needle 41 (such as a tungsten needle), as shown in FIGS. 2 and 5, a reliable contact cannot be achieved using metal 33A with a width a of 5 μm.

Because of the shape of the end of the tungsten needle 41, shown in FIG. 5, and because the diameter r of the end used for conventional mass production lines is 25–40 μm, at least one [metals 33A] can be effective in bringing the tungsten needle 41 into contact with the pad 33, without any relationship between the positions of the tungsten needle 41 and the metal line 33A, by arranging the branch 33A of the pad 33 with a width a of 10–20 μm to form a repetition pattern with pitch b, as shown in FIG. 2.

In this embodiment, since width a of the branch 33A of the pad 33 is 5 μm, pitch b is 10 μm, and the length of the conventional pad 23 along the cutting direction (approximately 100 μm, see FIG. 33) is arranged and is covered with the branch 33A having pitch b, an electrical contact between the tungsten needle 41 and the pad 33 equivalent to that using a conventional pad can be obtained.

The pad can function effectively by connecting the branch 33A of the pad 33 at a specific site to combine [all of the branches] so that they are electrically connected. FIG. 1 shows an embodiment of a pad in a fish-bone shape, which consists of a central fish-bone (connecting part 33B); and branched fish-bones (branch 33A) intermittently arranged from the connecting part toward both sides.

Because the thickness c (or the width) of the connecting part 33B may be 10 μm, which is equal to or less than the width of the blade for scribing (for embodiment, 35 μm), the alignment error of the blade when cutting (or dicing), becomes ±5 μm. When using a blade with a 35-μm thickness, the actual cutting width is approximately 40 μm when considering the mechanical damage width (approximately 5 μm) resulting from the cutting. Therefore, the thickness of the connecting part 33B is adequate for cutting. Regarding the alignment error, the thickness c of the connecting part 33B must be equal to or less than 30 μm. However, the thickness c of the connecting part 33B may depend on the blade used, and the connecting part 33B may not be placed in the central area of the pad 33, if there is a sufficient distance between connecting part 33B and both cutting lines A-A' and B-B'.

In this case, as seen in FIG. 6(A), if the length e along the scribed width of pad 33 is 75 μm, and if the branch 33A is cut to a 40-μm dicing width along both A-A' and B-B', after cutting, there will be 17.5 μm of the branch 33A remaining on both sides.

As seen in FIG. 6(B), in the case of optional alignment, because the branch 33A is minimal and 12.5 μm of branch 33A remains after cutting, the extended wiring 20 has no adverse influence, and the wiring 20 does not have to be cut.

A contact 33C with a size of 25 μm×25 μm, for embodiment, is placed in the central part of the pad 33. In the case of the optimal alignment shear, shown in FIG. 6(B), there is a 2.5-μm distance between the cutting line A-A' and the contact part 33C, so that the branch 33A with a small width (a) can be cut without cutting the contact 33C.

In the following, dicing of the semiconductor wafer containing the pad 33, which has the above-mentioned composition and is formed for testing the TEG in the scribe area 2, is described with reference to FIGS. 7–11.

Figure 7:
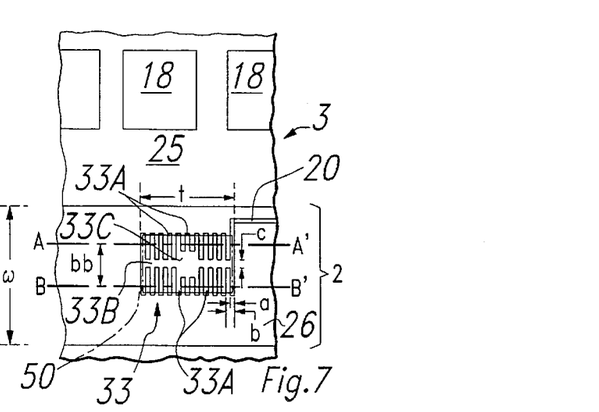
FIG. 7 is a plane and enlarged view showing the diced position in the same chip area shown in FIG. 1.

FIG. 7 shows the scribe area 2 with cutting lines (cut surfaces) A-A' and B-B'. Both of the cutting lines are placed on the branch 33A with a small width of the pad 33. On pad 33, a window 50 for a protective film opens and [the film] is removed, as is shown by the virtual line.

Figure 8:
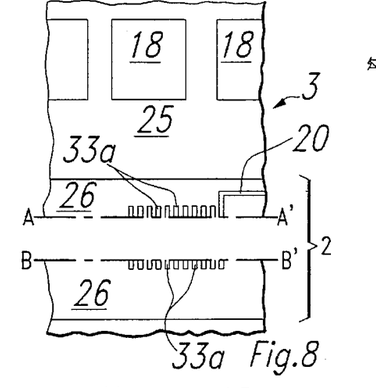
FIG. 8 is the same plane view shown in FIG. 1 after dicing.

Each semiconductor chip 3 is isolated by cutting the scribe area 2 with a blade along both A-A' and B-B', as shown in FIG. 8. The branch 33A of the pad 33 is cut along the arrangement direction (cutting direction); however, since the width a of each branch 33A is very small (approximately 5 μm), even if abatement is produced, the length of the abatement will be 5 μm or less, which is short.

Figure 11:
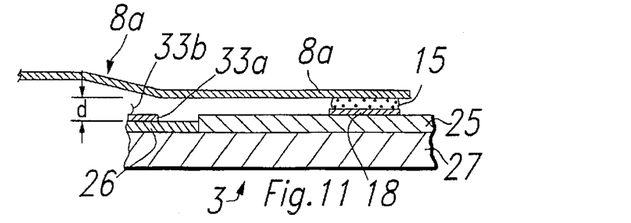
FIG. 11 is a cross-sectional view along line XI—XI shown in FIG. 9.

As seen in FIG. 9, after dicing, even if the inner lead 8a is bonded to the output pad 18 of the semiconductor chip 3 (same in the case of the input pad) when the branch 33a partially remains on the chip 3, as seen in both FIGS. 10 and 11, because the abatement 33b of the branch 33a that remains on the chip 3 is much shorter than distance d (15–20 μm), the inner lead 8a is not contacted.

Since the length of the abatement 33b, which is made by cutting the branch 33A, is equal to or less than the cutting width a (5 μm or less), [the abatement] does not reach the inner lead 8a from the chip 3, so short-circuiting between the inner lead 8a and the chip 3 or between the inner leads themselves cannot occur.

Since short abatement 33b can be produced, neither the scribed width nor the blade width needs to be increased to be larger than that of a pad, and the size of a pad does not need to be reduced in order to prevent production of abatement. The number of semiconductor chips made from one semiconductor wafer can thus be increased.

Following the above-mentioned dicing process and then the bonding process, the semiconductor device (package) is made. The above-mentioned branch 33a remains on the edge of the chip 3, which can be detected in the case of this product. The branch 33a influences neither the properties nor the performance of the product.

Figure 12:
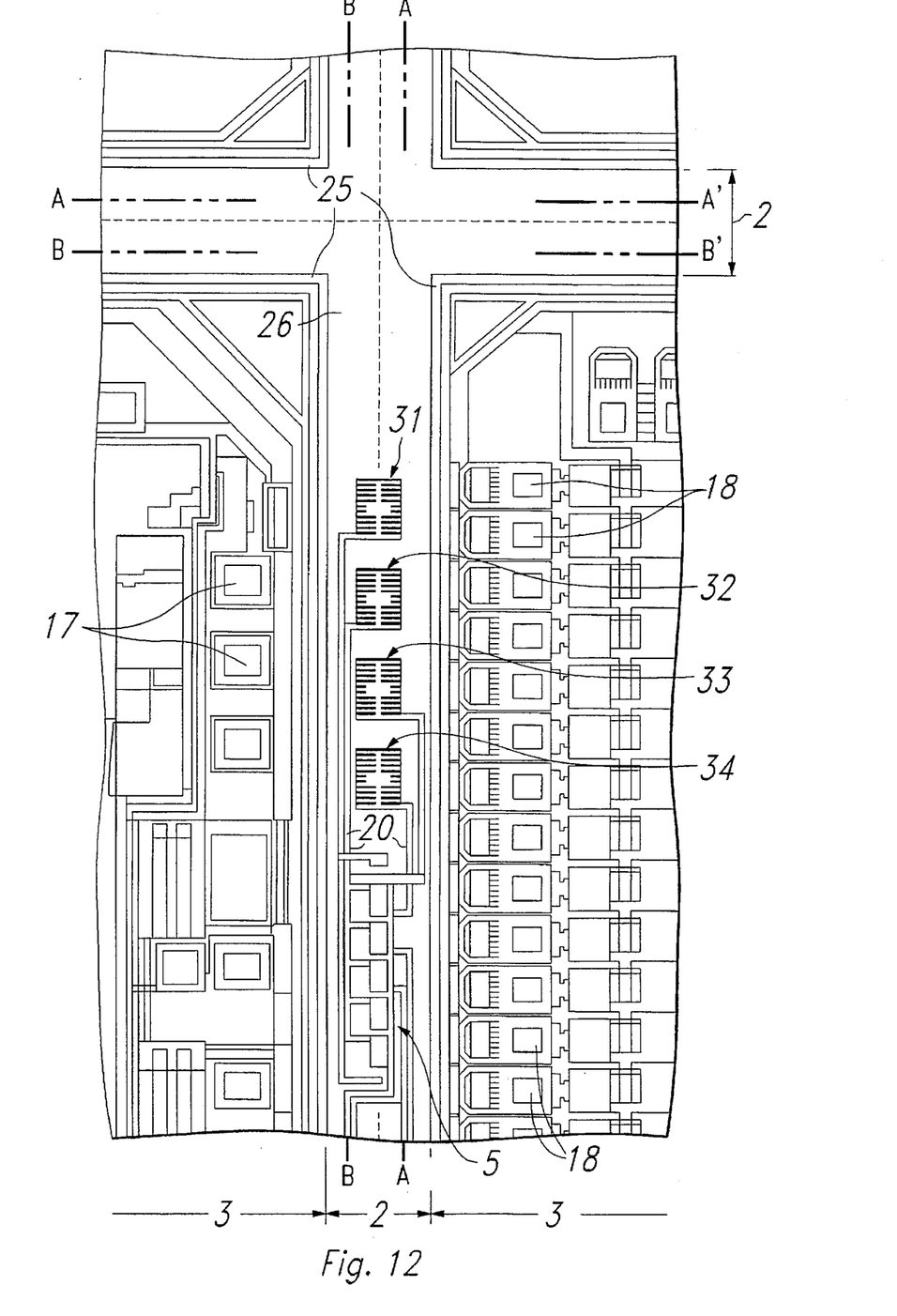
FIG. 12 is a plane and enlarged view showing details of the major area of the semiconductor wafer including the scribe area.
Figures 13A, 13B:
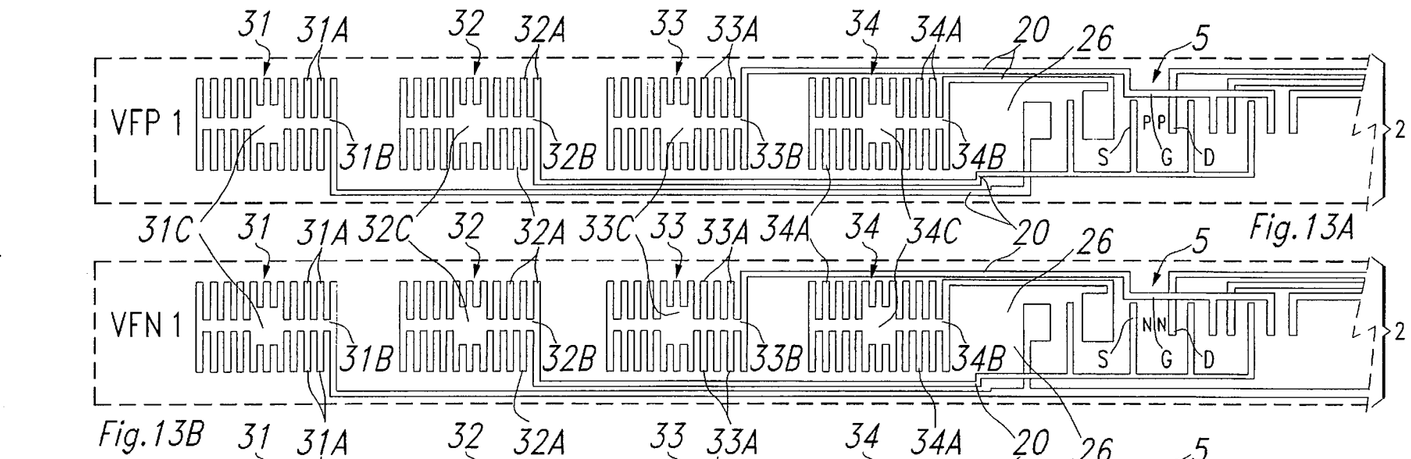
FIG. 13 is a plane view showing each pattern of the TEG (Test Element Group) in the scribe area of the semiconductor wafer.
Figures 13C, 13D:
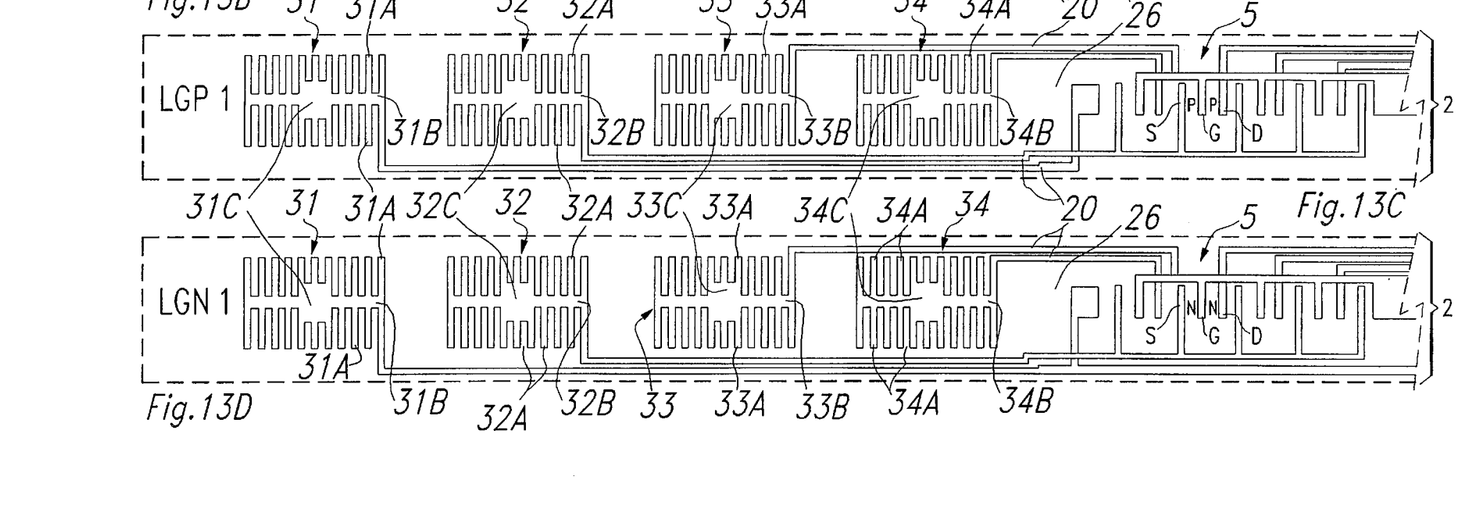
Figure 14:
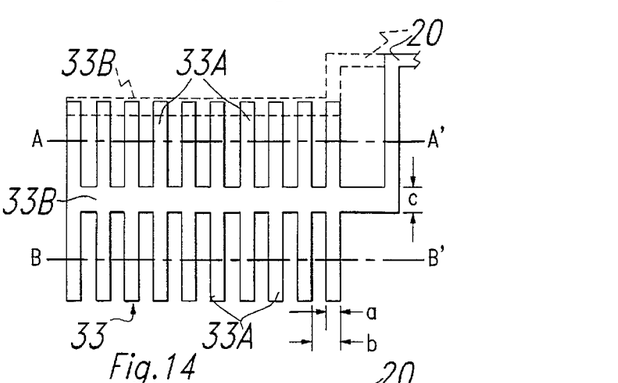
FIG. 14 is a plane view showing each pattern of the pad used for the other embodiments of this invention.

FIGS. 12-14 show detailed patterns of the major parts of the semiconductor wafer of this embodiment.

As seen in FIG. 12, the TEG 5 is placed in each scribe area; then, after testing the TEG, the scribe area 2 is cut along the cutting edges, as shown by A-A' and B-B', using a blade with a width equal to either A-B or A'-B'. The TEG 5 is formed of elements with different patterns. FIG. 13 shows four types of MOS transistors (VFP1, VFN1, LGP1, LGN1).

Each of the electrodes of the MOS transistor:is introduced to the pads (terminal electrodes) 31, 32, 33, 34, etc., on the insulating film 26 through the wiring 20. The pad is brought into contact with the probe needle to measure the electrical properties of the MOS transistor by the probe test. Pad 31 is formed using the same process used for the above-mentioned pad 33, and may be made of both a wiring 20 and a metal (such as aluminum containing small amounts of additives such as copper). The following branch 31A, 32A, 33A, and 34A; connecting part 31B, 32B, 33B, and 34B; contact part 31C, 32C, 33C, and 34C, are formed on each pad.

FIGS. 14-27 show various additional embodiments of this invention in which the shape of the pad 33 is modified.

FIG. 14 shows an embodiment in which the contact 33C has been removed from the central part of the pad, and in which the wiring 20 extends from the fish-bone (connecting part) 33B of pad 33.

In FIG. 14, the wiring may extend from the corner of the pad like the virtual line. If the connecting part 33B is isolated from the cutting lines A-A' and B-B', the connecting part 33B can be formed on the side edge of the pad, as shown by the virtual line in FIG. 14 (which is the same in other embodiments, such as that in FIG. 1).

Figure 15:
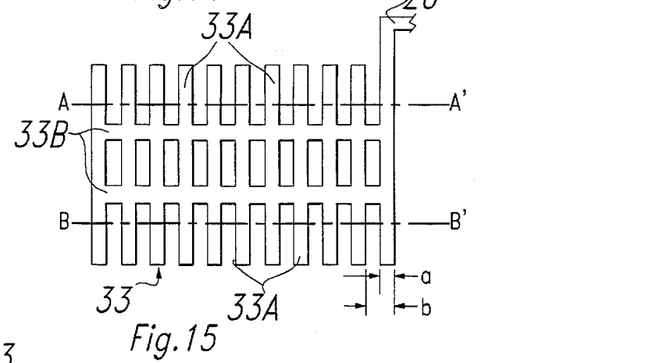
FIG. 15 is a plane view showing the pad pattern used for the other embodiments of this invention.

The connecting part 33B, which consists of one or more [parts] (e.g., two), may be formed as shown in FIG. 15.

Figure 16:
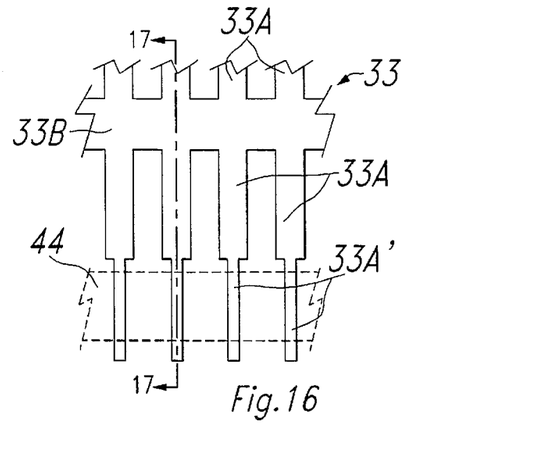
FIG. 16 is a plane view showing the major part of the pad used for the other embodiments of this invention.
Figure 17A:
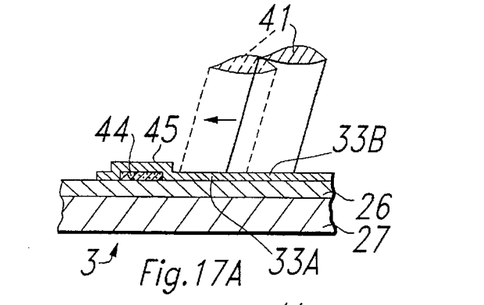
FIGS. 17(A) and 17(B) are cross-sectional view along line XVII—XVII shown in FIG. 16 and used in the probe process.

In the case of the embodiment shown in FIG. 16, the edge of branch 33A of pad 33 (for instance, 8-µm width) is narrow (for instance, 3-µm width), and a polysilicon layer 44 is placed under the narrow [edge] of part 33A', so that the point 45 shown in FIG. 17(A) is formed.

When the probe test is performed by bringing the probe needle 41 into contact with the pad 33, the point 45 prevents the dislocation of the probe needle 41 due to slipping. Since the point 45 is effective as a stop, probing can be done at a fixed position. As the width of the branch part 33A next to the connecting part 33B is comparatively large, the probe needle 41 can be brought into efficient contact [with branch 33A].

When placing the polysilicon layer 44, for the most part, under the branch 33A' of the pad 33, the polysilicon layer 44 may directly contact the branch 33A'. In this case, since the branches can be connected to each other by taking advantage of the conductivity of the polysilicon layer 44, a connecting part 33B is not required.

Figure 17B:
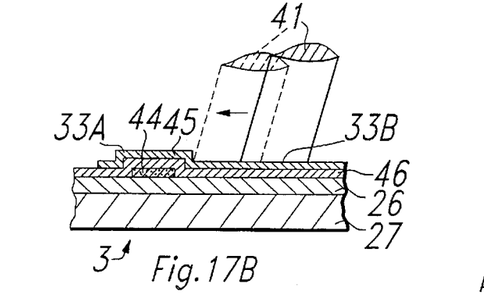

The insulating film 46 formed between the layers may be formed between the polysilicon layer 44 and the branch 33A', as shown in FIG. 17(B). In this case, since the point 45 can be made, the same effects described above can be achieved. Since the space between the polysilicon layer 44 and the branch 33A' is insulated by the insulating film between the layers 46, the polysilicon layer 44 extends between several pads (as shown in FIG. 13), so that the same composition shown in FIG. 17(B) can be made on each pad.

Figure 18:
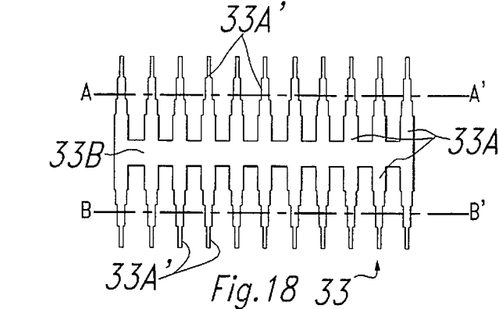
FIG. 18 is a plane view showing the pad pattern used for other embodiments of this invention.

FIG. 18 shows an embodiment in which the branch 33A of the pad 33 is modified to form [a branch 33A] whose width becomes narrower, using multiple steps (or sequentially) toward the edge.

Since the branch 33A located on the connecting part 33B side is comparatively wide, contact with the probe needle can be easily achieved. Since the branch 33A' on both cutting lines A-A' and B-B' is comparatively narrow, the length of the abatement will be short, which is advantageous.

Figure 19:
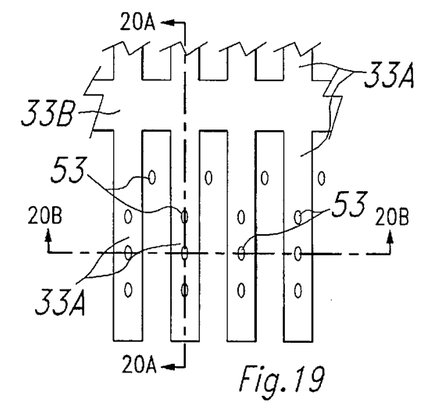
FIG. 19 is a plane view showing the major part of the pad used for the other embodiments of this invention.
Figure 20A:
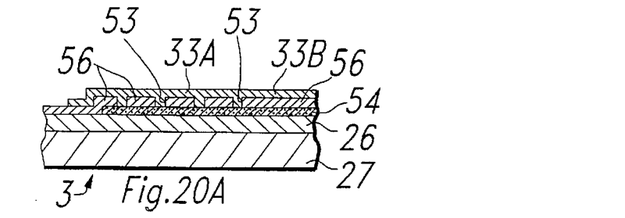
FIG. 20(A) is a cross-sectional view along line XXA—XXA in FIG. 19, and (B) is a cross-sectional view along line XXB—XXB in FIG. 19.
Figure 20B:
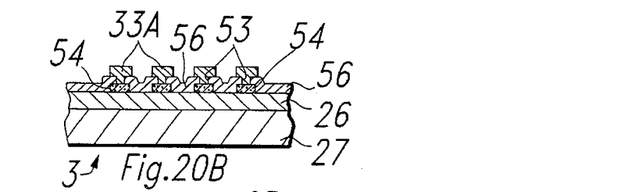

In the cases of the embodiments shown in FIGS. 19 and 20, the same pattern for the polysilicon layer 54 as that of the branch 33A is formed through the insulating film between layers 56 as the substrate layer for the branch 33A of the pad 33, and the branch 33A is connected to the polysilicon layer 54 through several contact holes 53 formed on the insulating film between the layers 56

In the cases of the above-mentioned embodiments, since the pad branch 33A is narrow, the above-mentioned advantageous effects result. However, as the branch 33A bends and rises during cutting, it is possible that long abatement may be produced.

Since the branch 33A is connected to the polysilicon layer 54, which is an underlayer, through the contact hole 53, the branch 33A has a good support, and cutting can be carried out suitably without rising or bending of the branch 33A. It is believed that an elliptical shape (connected surface), rather than a round shape, is desirable for the contact hole 53.

Figure 21:
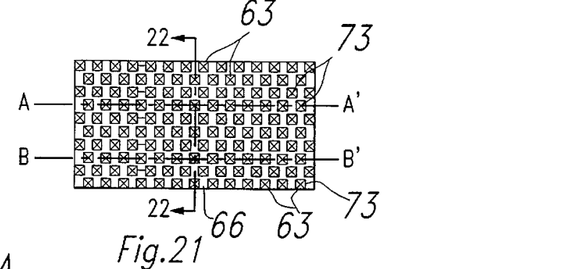
FIG. 21 is a plane view showing the pad pattern used for the other embodiments of this invention.
Figure 22:
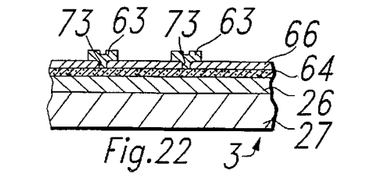
FIG. 22 is a cross-sectional view along line XXII-XXII shown in FIG. 21 and used in the probe process.

In the cases of FIGS. 21 and 22, on one of the pads (33) the metal layer 63 is intermittently formed along both the length and the width of the scribe area, and several lines of the metal layer 63 are formed along the above-mentioned lengths. The layers are alternatively and regularly arranged like a checkerboard.

The metal layers 63 are connected to the conductive substrate polysilicon layer 64 through the contact holes 73 of the insulating film between the layers 66 and the scribe area, including the metal layers 63, is cut along the above-mentioned length using lines A-A' and B-B'.

Since the semiconductor wafer of this embodiment is also intermittently formed along the cutting direction of the scribe area, short abatement of the metal layers 63 may be produced without modification of the scribed width, the blade width, or the size of the conductive layer.

Since [the metal layers] are well supported by the substrate polysilicon layer 64, island-shaped metal layers 63 can be intermittently formed without connecting the metal layers 63 along the width of the scribe area (perpendicularly crossing the length), so that isolated islands can be formed.

If substrate layer 64 is formed over the entire area of pad 33, and if [the layer 64] is conductive and the metal layer 63 can be effectively connected (can be connected between the metal layers), the above-mentioned connecting part need not be formed on the metal layer.

Figure 23:
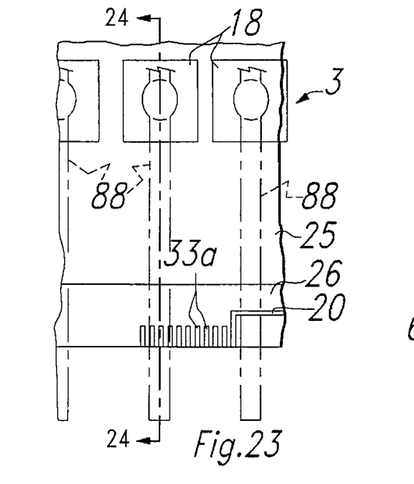
FIG. 23 shows a plane and enlarged view showing the major parts of the diced semiconductor wafer where the lead is bonded to the semiconductor chip; it is used for the other embodiments of this invention.
Figure 24:
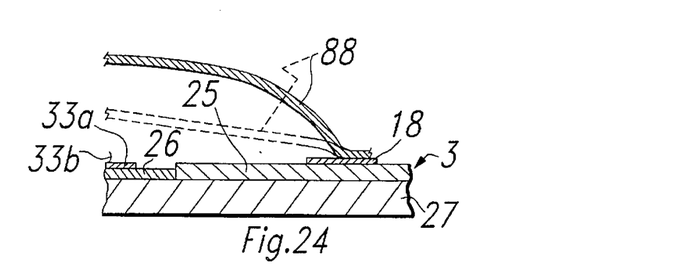
FIG. 24 is a cross-sectional view along line XXIV—XXIV shown in FIG. 23.

FIGS. 23 and 24 both show embodiments in which, after dicing the semiconductor wafer, bonding of the pad 18 of the semiconductor chip wiring is performed using wiring 88, instead of using the above-mentioned TCP bonding method (bump electrode 15 is not required).

Since short abatement 33C is produced by wiring bonding after the narrow branch 33A of the pad 33 is diced, even if the wiring 88 ends up like that represented by the virtual line, contact with the abatement 33a does not occur, with the result that there is no short-circuiting between the wiring 88 and the chip 3.

Figure 25:
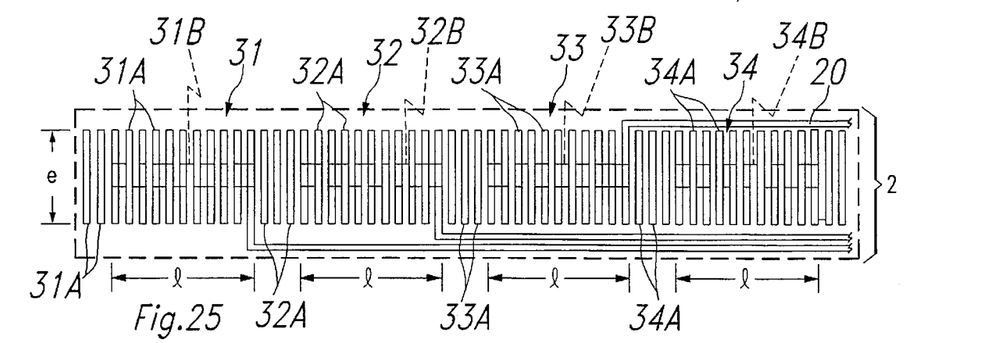
FIG. 25 is a plane view showing the pad pattern in the scribe area of the semiconductor wafer; it is used for the other embodiments of this invention.

When comparing the embodiment shown in FIG. 25 with the pad pattern shown in FIG. 13, metal layers (such as aluminum) with a width a and pitch b are sequentially formed along the length of the scribe area 2, and connecting parts 31B, 32B, 33B, and 34B, consisting of fish-bones, which appear as lengths 1 of pad 31 and 34 of the TEG, are formed under the above-mentioned metal layer with a substance other than the above-mentioned metal layer, such as a polysilicon layer 44 (shown in FIG. 17), so the above-mentioned polysilicon layer 44 is in contact with the above-mentioned metal layer.

Even if each of the metal layers is completely isolated, since each metal layer is bonded to other conductive bottom layers, a small ratio of metal layers results; this is followed by both a reduction in blade clogging and in the production of short metal abatement.

The embodiments of this invention have been explained in the previous sections. The above-mentioned applications can be modified according to the technical scope of this invention.

Since the above-mentioned pad metal pattern, whose cutting width is smaller than the length along the scribed width, is intermittently formed, the pattern can be modified. The metal pattern may not cross or be parallel to the length of the scribe area (along the scribe line). The width may vary. Any conventional wiring material can be used as the material of the pad metal.

The patterns, materials, bonding method, etc., for each part of the semiconductor water can be modified. In the embodiments described above, this invention is shown when LCD driver is used; however, this invention can be applied to various types of devices.

Since a conductive layer (such as a pad metal) is intermittently formed along the length of the scribe area (several conductive layers are formed at specific distances between the layers), and since the width of each of the conductive layers along the length of the scribe area is smaller than the length crossing the width, when the short width is cut, the cut width of the conductive layer can be made smaller than that of a conventional product, resulting in the production of short abatement when cutting.

When the lead is bonded to a cut semiconductor chip by abatement, the abatement does not come into contact with the lead; this results in effectively preventing short-circuiting either between the lead and the semiconductor chip or between the leads themselves. Because short abatement is produced, neither the scribed width nor the blade width needs to be increased, nor must the pad size be reduced, in order to prevent the production of abatement. The number of semiconductor chips made from the semiconductor wafer can be increased.

We claim:

1. A circuit wafer, testable with a probe of tip diameter r and diceable with a cutting tool of cutting width bb, comprising:

a semiconductor wafer providing a semiconductor substrate, portions of which are covered with an insulating film;

a plurality of circuits formed on the substrate, each coupled to bump electrodes having a top surface at a height d above the substrate's insulating film;

a plurality of scribe lines, of a width w greater than bb, traversing the semiconductor wafer between the circuits to provide scribe lanes of width w where the cutting tool can cut the circuit wafer into individual circuit chips; and a plurality of test circuits, formed in the scribe lanes, having test elements connected to test pad electrodes;

the test pad electrodes having a general longitudinal dimension t along the scribe lane greater than both height d and probe tip diameter p and comprising a first portion of longitudinal dimension about t, formed in the scribe lane so as be entirely cut away by the cutting tool during dicing, and a second portion of longitudinal dimension about t, formed in the scribe lane so as be cut by the cutting tool during dicing into pieces smaller than d.

2. The wafer of claim 1 wherein the first portion of the test pad electrode is a spine and the second portion is a plurality of ribs attached to the spine, each of width less than d.

3. The wafer of claim 1 wherein the test pad electrode is reticular.

4. A TEG test pad electrode, for deposit in a scribe lane on a wafer substrate supporting circuits with bump electrodes of top surface height d above an insulating film on the wafer substrate, and for use with a probe of tip diameter r and a wafer cutting tool, comprising a first portion of longitudinal dimension greater than both height d and probe tip diameter p, formed in the scribe lane so as be entirely cut away by the cutting tool during dicing, and a second portion of longitudinal dimension greater than both height d and probe tip diameter p, formed in the scribe lane so as be cut by the wafer cutting tool into pieces smaller than d.

5. The test pad electrode of claim 4 wherein the first portion of the test pad electrode is a spine and the second portion is a plurality of ribs attached to the spine, each of width less than d.

6. The test pad electrode of claim 4 wherein the test pad electrode is reticular.

* * * * *